United States Patent
Imafuji

(10) Patent No.: US 9,084,339 B2
(45) Date of Patent: Jul. 14, 2015

(54) WIRING SUBSTRATE AND METHOD OF MANUFACTURING THE SAME

(71) Applicant: SHINKO ELECTRIC INDUSTRIES CO., LTD., Nagano-shi, Nagano (JP)

(72) Inventor: Kei Imafuji, Nagano (JP)

(73) Assignee: SHINKO ELECTRIC INDUSTRIES CO., LTD., Nagano-shi, Nagano (JP)

(*) Notice: Subject to any disclaimer, the term of this patent is extended or adjusted under 35 U.S.C. 154(b) by 221 days.

(21) Appl. No.: 13/863,588

(22) Filed: Apr. 16, 2013

(65) Prior Publication Data
US 2013/0284499 A1  Oct. 31, 2013

(30) Foreign Application Priority Data
Apr. 26, 2012  (JP) .................. 2012-101887

(51) Int. Cl.
| | |
|---|---|
| H05K 1/00 | (2006.01) |
| H05K 3/00 | (2006.01) |
| H05K 1/02 | (2006.01) |
| H05K 3/24 | (2006.01) |
| H05K 3/42 | (2006.01) |

(52) U.S. Cl.
CPC ............. *H05K 3/00* (2013.01); *H05K 1/0296* (2013.01); *H05K 3/244* (2013.01); *H05K 3/429* (2013.01); *H05K 2201/0769* (2013.01); *H05K 2201/096* (2013.01)

(58) Field of Classification Search
CPC .......... H05K 1/16; H01L 21/02; H01L 21/50; H01L 21/56; H01L 21/58; H01L 23/02; H01L 23/31; H01L 23/48; H01L 23/52; H01L 23/485; H01L 23/498; H01L 24/11; H01L 24/12; H01L 24/16; H01L 24/97
USPC .......... 174/250, 257, 260, 261; 257/432, 434, 257/678, 704, 737, 758, 777, 778
See application file for complete search history.

(56) References Cited

U.S. PATENT DOCUMENTS

| | | | |
|---|---|---|---|
| 6,194,781 B1* | 2/2001 | Ikegami ..................... | 257/737 |
| 6,406,989 B1* | 6/2002 | Ikegami ..................... | 438/612 |
| 2004/0094841 A1* | 5/2004 | Matsuzaki et al. ............ | 257/758 |
| 2006/0170112 A1* | 8/2006 | Tanaka et al. ................ | 257/777 |
| 2008/0001241 A1* | 1/2008 | Tuckerman et al. .......... | 257/434 |

FOREIGN PATENT DOCUMENTS

JP    2008-227355 A    9/2008

* cited by examiner

*Primary Examiner* — Xiaoliang Chen
(74) *Attorney, Agent, or Firm* — Drinker Biddle & Reath LLP

(57) ABSTRACT

A wiring substrate includes: a wiring substrate body including a first surface and a second surface; a first electrode pad including a first recess therein and formed on the first surface of the wiring substrate body; a second electrode pad including a second recess therein and formed on the first surface of the wiring substrate body; a first solder resist layer on the first surface of the wiring substrate body to cover the first and second electrode pads, the first solder resist layer including a first opening and a second opening whose opening area is larger than that of the first opening; and a first metal layer electrically connected to the first electrode pad and made of a material whose ionization tendency is smaller than that of a material of the first electrode pad. A depth of the first recess is larger than that of the second recess.

9 Claims, 11 Drawing Sheets

WIRING SUBSTRATE AND METHOD OF MANUFACTURING THE SAME

This application claims priority from Japanese Patent Application No. 2012-101887, filed on Apr. 26, 2012, the entire contents of which are herein incorporated by reference.

BACKGROUND

1. Technical Field

Embodiments described herein relate to a wiring substrate and a method of manufacturing the wiring substrate.

2. Description of the Related Art

A method of electrically connecting pads of a wiring substrate and electrodes of a semiconductor chip to each other through solder bumps is widely known. In this method, a problem has occurred in which cracking occurs on the interface between the solder bump and the pad due to electromigration according to solder bump miniaturization and an increase in the current flowing through the solder bump in recent years and this cracking causes defective bonding.

As a method of reducing the electromigration, it is effective to increase the opening area of the pad. However, it is difficult to increase the opening areas of all pads due to the miniaturization of the design. For this reason, measures to increase the opening area of only a pad connected to a circuit, through which particularly large current flows, have been taken. That is, a plurality of kinds of pads with different opening areas are formed on the wiring substrate (see e.g., JP-A-2008-227355).

However, if electrode terminals are formed by mounting solder balls with the same diameter simultaneously on the pads with different opening areas or by forming solder bumps using a screen printing method, the height of the electrode terminal at the pad having a small opening area is larger than the height of the electrode terminal at the pad having a large opening area. As a result, since the electrode terminal whose height is smaller does not reach a semiconductor chip, there is a problem in that the wiring substrate and the semiconductor chip cannot be connected to each other.

In order to solve the above-described problem, a method of forming electrode terminals with the same height by mounting solder balls with different diameters on the pad having a large opening area and the pad having a small opening area may be considered. In this method, however, it is necessary to mount solder balls multiple times using a mask. For this reason, if the opening area becomes very small, high-accuracy mask alignment is required and therefore this is not practical.

As another method to solve the above-described problem, a method of forming electrode terminals with the same height by making the position of the pad having a small opening area lower than the position of the pad having a large opening area (by making the position of the pad having a small opening area deeper than the position of the pad having a large opening area) may be considered. In this method, it is possible to form electrode terminals with approximately the same height by mounting solder balls with the same diameter on the pad having a large opening area and the pad having a small opening area.

However, it is necessary to open only the pad having a small opening area by resist patterning, perform etching using an etchant, and make the pad having a small opening area deeper than the pad having a large opening area. For this reason, if the opening area becomes very small, high-accuracy alignment is required at the time of resist patterning and therefore this is not practical.

SUMMARY OF THE INVENTION

It is one of objects of the present invention to provide a method of manufacturing a wiring substrate, which is capable of appropriately controlling the depth of pads with different opening areas.

According to one or more aspects of the present invention, there is provided a wiring substrate. The wiring substrate comprises: a wiring substrate body comprising a wiring layer and an insulating layer and comprising a first surface and a second surface opposite to the first surface; a first electrode pad comprising a first recess therein and formed on the first surface of the wiring substrate body; a second electrode pad comprising a second recess therein and formed on the first surface of the wiring substrate body; a first solder resist layer on the first surface of the wiring substrate body to cover the first and second electrode pads, the first solder resist layer comprising a first opening and a second opening whose opening area is larger than that of the first opening, wherein the first recess is exposed through the first opening and the second recess is exposed through the second opening; a third electrode pad formed on the first surface or the second surface of the wiring substrate body; and a first metal layer formed on the third electrode pad and electrically connected to the first electrode pad and made of a material whose ionization tendency is smaller than that of a material of the first electrode pad, wherein a depth of the first recess is larger than that of the second recess.

According to one ore more aspects of the present invention, there is provided a method of manufacturing a wiring substrate. The method comprises: (a) providing a wiring substrate body comprising a wiring layer and an insulating layer and comprising a first surface and a second surface opposite to the first surface; (b) forming a first electrode pad and a second electrode pad on the first surface of the wiring substrate body; (c) forming a first solder resist layer on the first surface of the wiring substrate body to cover the first and second electrode pads; (d) forming a first opening and a second opening through the first solder resist layer such that the first electrode pad is exposed through the first opening and the second electrode pad is exposed through the second opening, wherein an opening area of the second opening is larger than that of the first opening; (e) forming a third electrode pad on the first surface or the second surface of the wiring substrate body; (f) forming a first metal layer on the third electrode pad such that the first metal layer is electrically connected to the first electrode pad, wherein the first metal layer is made of a material whose ionization tendency is smaller than that of a material of the first electrode pad; and (g) forming a first recess in the first electrode pad and forming a second recess in the second electrode by wet-etching the first and second electrode pads using an etchant in a state that the first and second electrode pads and the first metal layer are in contact with the etchant, wherein a depth of the first recess is larger than that of the second recess.

DETAILED DESCRIPTION OF EXEMPLARY EMBODIMENTS

Figure 1A:
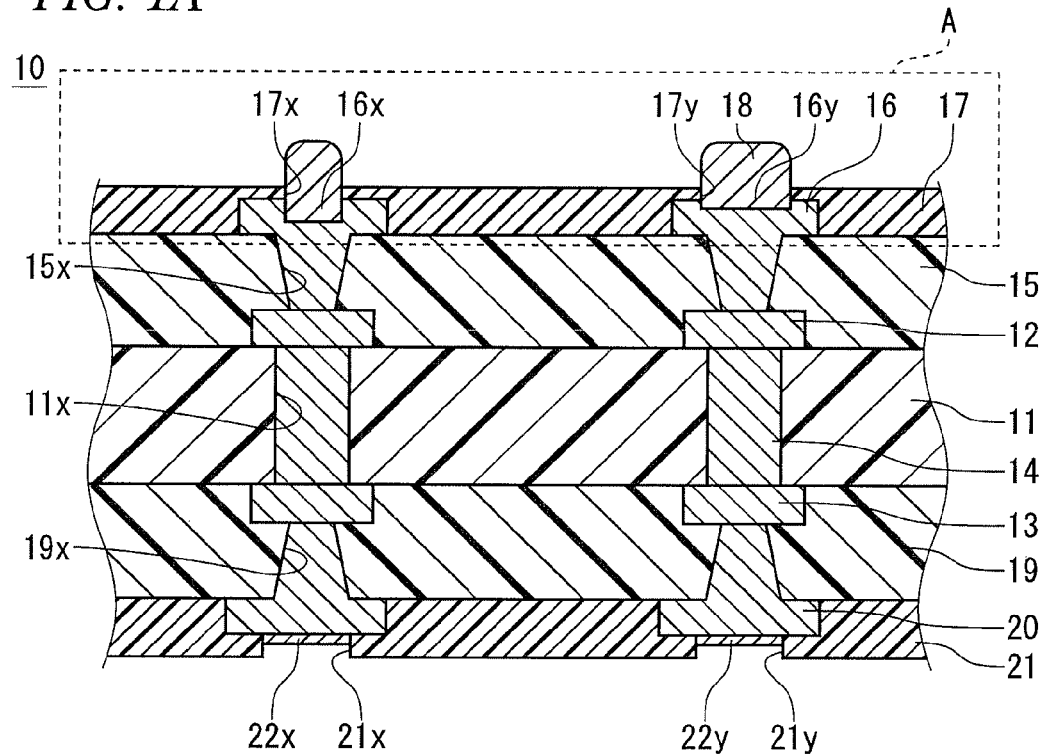
FIGS. 1A and 1B are cross-sectional views illustrating a wiring substrate according to a first embodiment.

Hereinafter, exemplary embodiments of the present invention will be described with reference to the accompanying drawings. In all the drawings for the explanation of the embodiments, the members having the same functions are represented by the same reference numerals, and repeated description thereof will be omitted.

First Embodiment

Figure 1B:
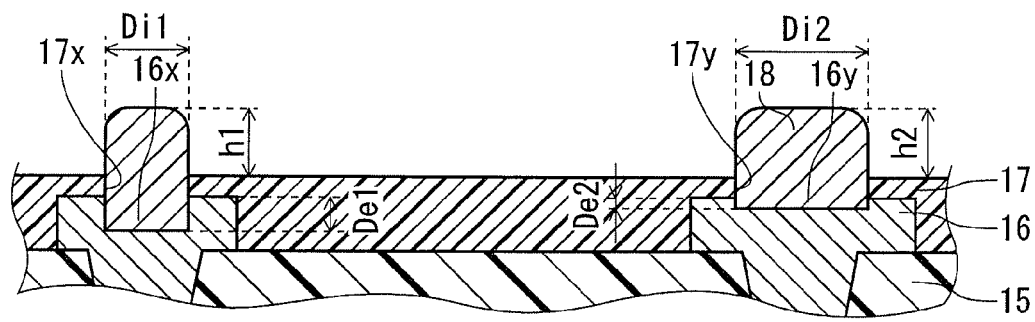

First, the structure of a wiring substrate according to a first embodiment will be described. FIG. 1A is a cross-sectional view illustrating the wiring substrate according to the first embodiment. In addition, FIG. 1B is an enlarged view of an A portion of FIG. 1A.

Referring to FIG. 1A, a wiring substrate 10 according to the first embodiment includes a core layer 11, a wiring layer 12, a wiring layer 13, a through electrode 14, an insulating layer 15, a wiring layer 16, a solder resist layer 17, an electrode terminal 18, an insulating layer 19, a wiring layer 20, a solder resist layer 21, a first metal layer 22x, and a second metal layer 22y. In this embodiment, the insulating layer 15, the core layer 11 and the insulating layer 19 functions as a wiring substrate body. The solder resist layer 17 is formed on one surface of the wiring substrate body to cover the wiring layer 16, while the solder resist layer 21 is formed on the other surface of the wiring substrate body to cover the wiring layer 20.

In the wiring substrate 10, the wiring layer 12 is formed on one surface of the core layer 11, and the wiring layer 13 is formed on the other surface of the core layer 11. The wiring layers 12 and 13 are electrically connected to each other by the through electrode 14 provided in a through hole 11x passing through the core layer 11 in the thickness direction. Each of the wiring layers 12 and 13 is patterned in a predetermined planar shape. In addition, the through electrode 14 does not necessarily need to be formed so as to fill the through hole 11x.

As the core layer 11, it is possible to use a so-called glass epoxy substrate formed by impregnating a glass cloth with epoxy-based resin, for example. The thickness of the core layer 11 may be set to about several hundreds of micrometers, for example. As materials of the wiring layers 12 and 13 and the through electrode 14, it is possible to use a metal containing copper (Cu) and the like, for example. The thickness of each of the wiring layers 12 and 13 may be set to about 10 μm to 20 μm, for example. The diameter of the through electrode 14 may be set to about several tens of micrometers, for example.

The insulating layer 15 is formed on one surface of the core layer 11 so as to cover the wiring layer 12. As a material of the insulating layer 15, it is possible to use an insulating resin containing epoxy-based resin as a main component, for example. The insulating layer 15 may contain a filler, such as silica ($SiO_2$). The thickness of the insulating layer 15 may be set to about 15 μm to 35 μm, for example.

The wiring layer 16 is formed on the insulating layer 15. The wiring layer 16 is configured to include a through electrode filled in a via hole 15x, which passes through the insulating layer 15 and through which one surface of the wiring layer 12 is exposed, and a wiring pattern (an electrode pad) formed on the insulating layer 15. The via hole 15x is a truncated conical recess which is open on the side of the solder resist layer 17, whose bottom surface is formed by one surface of the wiring layer 12, and in which the area of the opening is larger than the area of the bottom surface. The material or the thickness of the wiring layer 16 may be the same as that of the wiring layer 12, for example.

A recess 16x and a recess 16y are formed in the wiring layer 16. The planar shape of each of the recesses 16x and 16y is a circle, for example, but the diameters and depths of the recesses 16x and 16y are different. Specifically, the diameter Di1 of the recess 16x is smaller than the diameter Di2 of the recess 16y. The depth De1 (depth from the top surface of the wiring layer 16 to the bottom surface of the recess 16x) of the recess 16x is larger than the depth De2 (depth from the top surface of the wiring layer 16 to the bottom surface of the recess 16y) of the recess 16y.

For example, the diameter Di1 of the recess 16x may be set to about 50 μm, and the diameter Di2 of the recess 16y may be set to about 60 μm. For example, the depth De1 of the recess 16x may be set to about 5 μm, and the depth De2 of the recess 16y may be set to about 1 μm.

In addition, the wiring layer 16 is a typical example of a wiring layer according to the present invention. In addition, metal such as copper that forms the wiring layer 16 is a typical example of the first metal according to the present invention.

The solder resist layer 17 is formed on the insulating layer 15 so as to cover the wiring layer 16. For example, the solder resist layer 17 may be formed of a photosensitive resin or the like. The thickness of the solder resist layer 17 may be set to about 15 μm to 35 μm, for example. In addition, the solder resist layer 17 is a typical example of a solder resist layer that is an outermost layer on the one side according to the present invention.

The solder resist layer 17 has an opening 17x and an opening 17y having a larger opening area than the opening 17x, and the recesses 16x and 16y are exposed in the openings 17x and 17y, respectively. The diameters of the openings 17x and 17y are slightly smaller than the diameters of the recesses 16x and 16y.

In addition, the recesses 16x and 16y exposed from the openings 17x and 17y function as pads that are electrically connected to a semiconductor chip (not shown) or the like.

If necessary, a metal layer may be formed on the inner bottom surface or the internal surface of each of the recesses 16x and 16y exposed in the openings 17x and 17y, or anti-oxidation processing may be performed. Examples of the metal layer formed on the inner bottom surface or the internal surface of each of the recesses 16x and 16y may include an Au layer, an Ni/Au layer (metal layer formed by laminating an Ni layer and an Au layer in this order), and an Ni/Pd/Au layer (metal layer formed by laminating an Ni layer, a Pd layer, and an Au layer in this order). The thickness of the metal layer formed on the inner bottom surface or the internal surface of each of the recesses 16x and 16y may be set to about 0.03 μm to 10 μm, for example.

In addition, an electrode pad of the wiring layer 16 may be formed so as to be drawn on the insulating layer 15, and the recesses 16x and 16y may be disposed in the wiring pattern drawn on the insulating layer 15 such that the recesses 16x and 16y are exposed in the openings 17x and 17y, respectively. That is, the recesses 16x and 16y may be disposed in a portion other than the via hole 15x of the wiring layer 16.

In the recesses 16x and 16y, the electrode terminal 18 that fills each of the recesses 16x and 16y and protrudes from one surface of the solder resist layer 17 is formed. The electrode terminal 18 functions as a terminal that is electrically connected to a semiconductor chip (not shown) or the like.

As examples of the material of the electrode terminal 18, an alloy containing Pb, an alloy of Sn and Cu, an alloy of Sn and Ag, and an alloy of Sn, Ag, and Cu may be used. The height (maximum height) $h_1$ of the electrode terminal 18, which is formed in the recess 16x, from one surface of the solder resist layer 17 is approximately the same as the height (maximum height) $h_2$ of the electrode terminal 18, which is formed in the recess 16y, from one surface of the solder resist layer 17. The height (maximum height) $h_1$ and $h_2$ may be set to about 30 μm, for example.

In addition, the reason why the openings 17x and 17y with different opening areas are formed in the solder resist layer 17 is to reduce the electromigration as described above. That is, since it is difficult to increase the opening area of all pads due to the miniaturization of the design, the opening area of only the pad connected to a circuit, through which particularly large current flows, is increased to reduce the electromigration. In the case shown in FIG. 1A, the first pad 16x exposed in the opening 17x with a small opening area corresponds to a pad connected to a circuit through which relatively small current flows, and the second pad 16y exposed in the opening 17y with a large opening area corresponds to a pad connected to a circuit through which large current flows.

In addition, the reason why the recesses 16x and 16y with different depths are formed is that the height of the electrode terminal 18 can be fixed even if the electrode terminal 18 is formed by mounting solder balls with the same diameter simultaneously on the recesses 16x and 16y with different opening areas and performing reflow. In other words, the depth of each of the recesses 16x and 16y is set such that the height of the electrode terminal 18 after reflow process is fixed even if the electrode terminal 18 is formed by mounting solder balls with the same diameter simultaneously and performing reflow.

In addition, although the electrode terminal 18 is formed in the present embodiment, the electrode terminal 18 does not necessarily need to be formed at this point in time. In short, exposing a part of the wiring layer 16 from the solder resist layer 17 so that the electrode terminal 18 can be formed is sufficient. Then, it is preferable to form the electrode terminal 18 when necessary (by the time when the wiring substrate 10 is bonded to a semiconductor chip or the like).

The insulating layer 19 is formed on the other surface of the core layer 11 so as to cover the wiring layer 13. The material or the thickness of the insulating layer 19 may be the same as that of the insulating layer 15, for example.

The wiring layer 20 is formed on the insulating layer 19. The wiring layer 20 is configured to include a through electrode filled in a via hole 19x, which passes through the insulating layer 19 and through which the other surface of the wiring layer 13 is exposed, and an electrode pad formed on the insulating layer 19. The via hole 19x is a truncated conical recess which is open on the side of the solder resist layer 21, whose bottom surface is formed by the other surface of the wiring layer 13, and in which the area of the opening is larger than the area of the bottom surface. The material or the thickness of the wiring layer 20 may be the same as that of the wiring layer 12, for example. In addition, the wiring layer 20 is a typical example of the other wiring layer according to the present invention.

The solder resist layer 21 is formed on the insulating layer 19 so as to cover the wiring layer 20. The material or the thickness of the solder resist layer 21 may be the same as that of the solder resist layer 17, for example. The solder resist layer 21 has an opening 21x and an opening 21y, and a part of wiring layer 20 is exposed in the openings 21x and 21y.

For example, the planar shape of the wiring layer 20 exposed in the opening 21x may be a circle, and the diameter may be set to about 300 μm. In addition, for example, the planar shape of the wiring layer 20 exposed in the opening 21y may be a circle, and the diameter may be set to about 300 μm. In the present embodiment, the diameters of the openings 21x and 21y are approximately the same.

In addition, the solder resist layer 21 is a typical example of the other solder resist layer that is an outermost layer on the one side according to the present invention.

The first metal layer 22x is formed on the wiring layer 20 exposed in the opening 21x. The first metal layer 22x has a first surface, which is in contact with the exposed surface of the wiring layer 20 exposed in the opening 21x, and a second surface, which is an opposite surface to the first surface. The second surface of the first metal layer 22x is exposed from the solder resist layer 21. The first metal layer 22x is electrically connected to the first pad 16x, which is formed in the wiring layer 16, through the wiring layer 20, the wiring layer 13, the through electrode 14, and the wiring layer 12.

The second metal layer 22y is formed on the wiring layer 20 exposed in the opening 21y. The second metal layer 22y has a first surface, which is in contact with the exposed surface of the wiring layer 20 exposed in the opening 21y, and a second surface, which is an opposite surface to the first surface. The second surface of the second metal layer 22y is exposed from the solder resist layer 21. The second metal layer 22y is electrically connected to the second pad 16y, which is formed in the wiring layer 16, through the wiring layer 20, the wiring layer 13, the through electrode 14, and the wiring layer 12.

The outermost layer (layer exposed from the solder resist layer 21) of each of the first and second metal layers 22x and 22y is formed of second metal having a smaller ionization tendency than metal (first metal) such as copper that forms the wiring layer 16. In addition, each of the first and second metal layers 22x and 22y may be configured to include only one layer. In this case, each of the first and second metal layers 22x and 22y is the outermost layer. When each of the first and second metal layers 22x and 22y is configured to include only one layer, an Au layer may be used as each of the first and second metal layers 22x and 22y.

In addition, each of the first and second metal layers 22x and 22y may be configured to include a plurality of layers. In this case, a layer exposed from the solder resist layer 21 among the plurality of layers is the outermost layer. Specifically, an Ni/Au layer (metal layer formed by laminating an Ni layer and an Au layer in this order) and an Ni/Pd/Au layer (metal layer formed by laminating an Ni layer, a Pd layer, and an Au layer in this order) may be used, for example. That is, the outermost layer of each of the first and second metal layers 22x and 22y in this case is the Au layer. In addition, a typical example of the second metal according to the present invention is gold (Au).

Each of the first and second metal layers 22x and 22y functions as a pad that is electrically connected to a mounting board (not shown), such as a mother board. It is also possible to form external connection terminals, such as solder balls or lead pins, on the first and second metal layers 22x and 22y.

In addition, the electrode pad of the wiring layer 20 may be formed on the insulating layer 19, and the openings 21x and 21y may be disposed to expose the wiring pattern on the insulating layer 19. That is, the openings 21x and 21y may be disposed to expose a portion other than the via hole 19x of the wiring layer 20.

In the wiring substrate 10, the area of the second surface of the first metal layer 22x exposed in the opening 21x is approximately the same as the area of the second surface of the second metal layer 22y exposed in the opening 21y. In addition, the area of the exposed surface of the wiring layer 16 exposed in the opening 17y is larger than the area of the exposed surface of the wiring layer 16 exposed in the opening 17x. As a result, the area ratio between the second surface of the first metal layer 22x exposed in the opening 21x and the exposed surface of the wiring layer 16 exposed in the opening 17x is larger than the area ratio between the second surface of the second metal layer 22y exposed in the opening 21y and the exposed surface of the wiring layer 16 exposed in the opening 17y.

Thus, in the present embodiment, the recesses 16x and 16y having different diameters and depths are formed in the wiring layer 16. In addition, a portion in which the recess 16x having a small diameter and a large depth is formed is electrically connected to the first metal layer 22x through the wiring layer 12, the through electrode 14, the wiring layer 13, and the wiring layer 20. In addition, a portion in which the recess 16y having a larger diameter and a smaller depth than the recess 16x is formed is electrically connected to the second metal layer 22y through the wiring layer 12, the through electrode 14, the wiring layer 13, and the wiring layer 20. In addition, in the present embodiment, metal having a smaller ionization tendency than the material (first metal) of the wiring layer 16, which forms the recesses 16x and 16y, is selected as the material (second metal) of the outermost layer of each of the first and second metal layers 22x and 22y. A technical meaning of this structure will be described later.

Figure 2A:
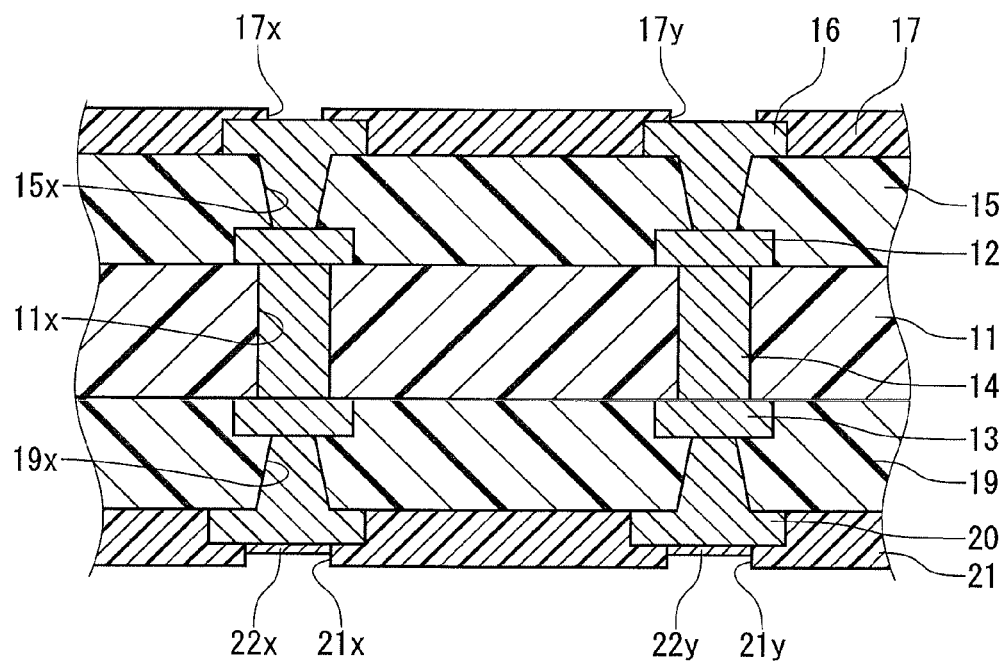
FIGS. 2A and 2B are diagrams illustrating the process of manufacturing the wiring substrate according to the first embodiment.
Figure 2B:
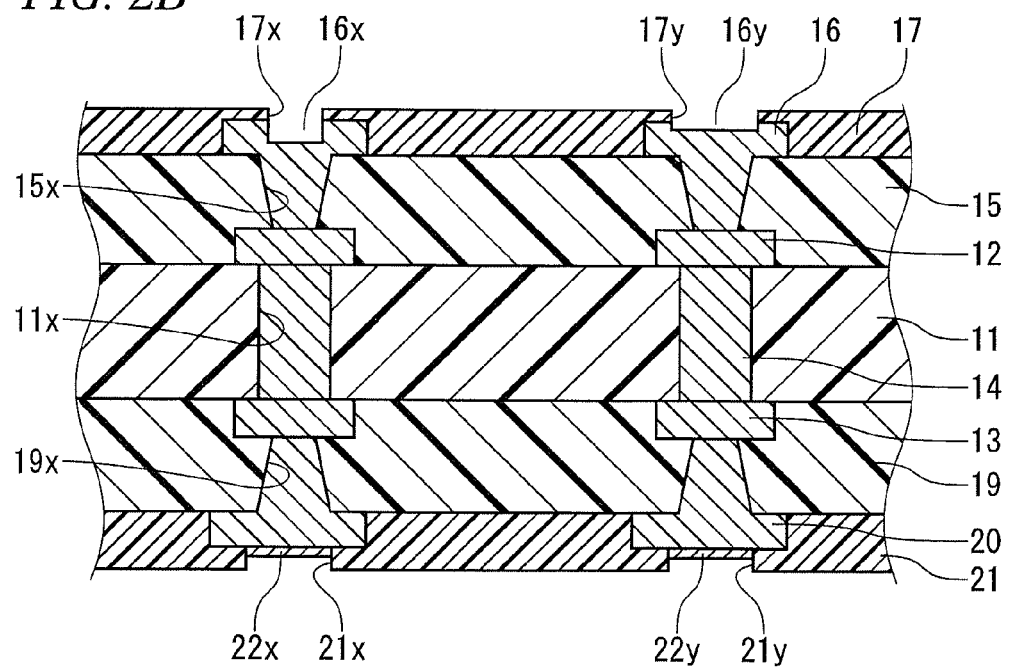

Next, a method of manufacturing the wiring substrate according to the first embodiment (including a pad forming method) will be described. FIGS. 2A and 2B are diagrams illustrating the process of manufacturing the wiring substrate according to the first embodiment.

First, in the process shown in FIG. 2A, the through hole 11x is formed in the core layer 11 using a known method, and the through electrode 14 is formed in the through hole 11x. Then, the wiring layer 12 is formed on one surface of the core layer 11 and the wiring layer 13 is formed on the other surface, and the wiring layers 12 and 13 are patterned into a predetermined planar shape. Then, film-like epoxy-based resin or the like is laminated on one surface of the core layer 11 so as to cover the wiring layer 12, thereby forming the insulating layer 15. In addition, film-like epoxy-based resin or the like is laminated on the other surface of the core layer 11 so as to cover the wiring layer 13, thereby forming the insulating layer 19. Alternatively, instead of laminating the film-like epoxy-based resin or the like, liquid or paste-like epoxy-based resin or the like may be coated and cured.

Then, the via hole 15x, which passes through the insulating layer 15 and through which one surface of the wiring layer 12 is exposed, is formed in the insulating layer 15. In addition, the via hole 19x, which passes through the insulating layer 19 and through which the other surface of the wiring layer 13 is exposed, is formed in the insulating layer 19. The via holes 15x and 19x can be formed by laser processing using a $CO_2$ laser, for example. After forming the via holes 15x and 19x, it is preferable to remove the resin residue adhering to the surfaces of the wiring layers 12 and 13, which are exposed at the bottom portions of the via holes 15x and 19x, by performing desmear processing.

Then, the wiring layer 16 is formed on the insulating layer 15. The wiring layer 16 is configured to include a through electrode filled in the via hole 15x and a wiring pattern formed on the insulating layer 15. The wiring layer 16 is electrically connected to the wiring layer 12 exposed at the bottom portion of the via hole 15x. Similarly, the wiring layer 20 is formed on the insulating layer 19.

The wiring layer 20 is configured to include a through electrode filled in the via hole 19x and a wiring pattern formed on the insulating layer 19. The wiring layer 20 is electrically connected to the wiring layer 13 exposed at the bottom portion of the via hole 19x. As materials of the wiring layers 16 and 20, it is possible to use copper (Cu), for example. The wiring layers 16 and 20 can be formed using various kinds of wiring forming methods, such as a semi-additive method or a subtractive method.

Then, the solder resist layer 17 that covers the wiring layer 16 is formed on the insulating layer 15. For example, the solder resist layer 17 can be formed by applying liquid or paste-like photosensitive epoxy-based insulating resin on the insulating layer 15 so as to cover the wiring layer 16 using a screen printing method, a roll coat method, a spin coat method, or the like. Alternatively, the solder resist layer 17 may be formed by laminating film-like photosensitive epoxy-based insulating resin on the insulating layer 15 so as to cover the wiring layer 16, for example. Similarly, the solder resist layer 21 that covers the wiring layer 20 is formed on the insulating layer 19.

Then, the openings 17x and 17y are formed in the solder resist layer 17 by exposing or developing the applied or laminated insulating resin (photolithographic method). In addition, the openings 21x and 21y are formed in the solder resist layer 21 (photolithography method). The planar shapes of the openings 17x and 17y and the openings 21x and 21y may be circles, for example. The diameter of the opening 17x may be set to about 50 µm, for example. The diameter of the opening 17y may be set to about 60 µm, for example. The diameter of each of the openings 21x and 21y may be set to about 300 µm, for example.

Then, the first and second metal layers 22x and 22y are formed on the wiring layer 20 exposed in the opening 21x and the wiring layer 20 exposed in the opening 21y, respectively, using a known technique. For example, the first and second metal layers 22x and 22y are formed using an electroless plating method or the like. As the first and second metal layers 22x and 22y, an Au layer, an Ni/Au layer (metal layer formed by laminating an Ni layer and an Au layer in this order), an Ni/Pd/Au layer (metal layer formed by laminating an Ni layer, a Pd layer, and an Au layer in this order), and the like may be used.

As described above, in the present embodiment, metal having a smaller ionization tendency than the material of the wiring layer 16 is selected as the material of the outermost layer of each of the first and second metal layers 22x and 22y. Specifically, gold (Au) is selected as the material of the outermost layer of each of the first and second metal layers 22x and 22y, and copper (Cu) is selected as the material of the wiring layer 16.

Then, in the process shown in FIG. 2B, the entire structure shown in FIG. 2A is immersed in the etchant (etchant using an oxidizing agent) capable of etching the material that forms the wiring layer 16. That is, the exposed surface of the wiring layer 16 exposed in the opening 17x, the exposed surface of the wiring layer 16 exposed in the opening 17y, the second surface of the first metal layer 22x exposed from the opening 21x, and the second surface of the second metal layer 22y exposed from the opening 21y come into contact with the etchant. As the etchant using an oxidizing agent, for example, a sulfuric acid hydrogen based etchant or a persulfate-based etchant may be used.

In this manner, the exposed surface of the wiring layer 16 exposed in the opening 17x and the exposed surface of the wiring layer 16 exposed in the opening 17y are removed by etching. As a result, the recess 16x and the recess 16y, which are recesses having circular planar shapes, are formed in the openings 17x and 17y, respectively.

In this case, according to the relationship between the diameters of the openings 17x and 17y, the diameter of the recess 16x is smaller than the diameter of the recess 16y. In addition, the depth of the recess 16x is larger than the depth of the recess 16y. For example, the diameter of the recess 16x may be set to about 50 μm, and the diameter of the recess 16y may be set to about 60 μm. For example, the depth of the recess 16x may be set to about 5 μm, and the depth of the recess 16y may be set to about 1 μm.

Figure 3A:
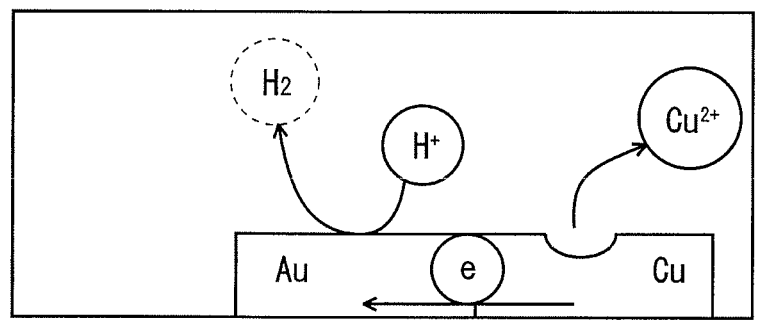
FIGS. 3A and 3B are diagrams for explaining the galvanic effect.
Figure 3B:
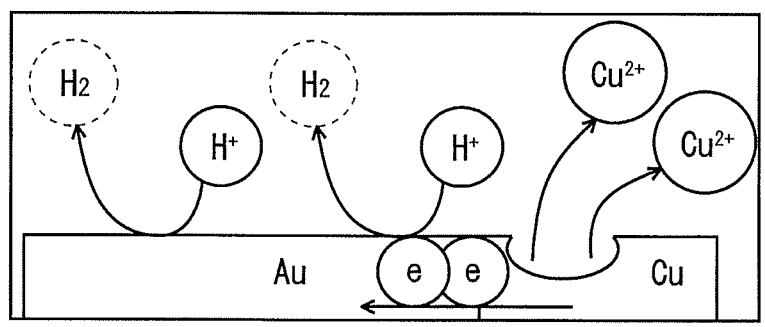

Here, the reason why the depth of the recess 16x is larger than the depth of the recess 16y will be described with reference to FIGS. 3A and 3B. FIGS. 3A and 3B are diagrams for explaining the galvanic effect, and schematically show how a circuit, to which gold (Au) or copper (Cu) is connected, is treated with copper (Cu) etchant.

Assume that in a circuit where dissimilar metals (in this case, gold (Au) and copper (Cu)) are connected to each other as shown in FIG. 3A, oxidation-reduction reaction of the metal having a larger ionization tendency (in this case, copper (Cu)) is allowed to proceed with the etchant. In this case, the galvanic effect occurs in which the metal side (standard electrode potential is a positive side) having a larger ionization tendency in the circuit where the dissimilar metals are connected to each other is excessively etched compared with a case where the dissimilar metal is not connected. That is, in this case, copper (Cu) connected to gold (Au) is excessively etched compared with a case where copper (Cu) is not connected to gold (Au).

Specifically, copper (Cu) serves as a local anode, and gold (Au) serves as a local cathode. Then, Cu→Cu$^{2+}$+2e reaction occurs in the local anode, and 2H$^+$+2e→H$_2$ reaction occurs in the local cathode. As a result, copper (Cu) which is the local anode is etched.

In addition, electron (e) used in the 2H$^+$+2e→H$_2$ reaction in the local cathode is supplied from copper (Cu) which is the local anode. Therefore, the amount of etching of copper (Cu) increases as the area ratio of gold (Au) and copper (Cu) increases. For example, the amount of etching of copper (Cu) in the case shown in FIG. 3B is larger than that in the case shown in FIG. 3A since the area ratio of gold (Au) and copper (Cu) in the case shown in FIG. 3B is larger than that in the case shown in FIG. 3A. That is, the etching rate in the case shown in FIG. 3B is higher than that in the case shown in FIG. 3A. The principle in which the oxidation-reduction reaction rate (etching rate) is determined according to the area ratio is called the principle of complementary area of Evans (catchment area principle), and the relationship of Expression 1 is satisfied.

$$P = Po \cdot \left(1 + \frac{S_{noble}}{S_{base}}\right) \quad (1)$$

Here, P is a corrosion rate of a less noble metal (in this case, copper), Po is a corrosion rate when only the less noble metal is present, $S_{base}$ is the area of the less noble metal, and $S_{noble}$ is the area of a noble metal (in this case, gold).

In addition, in order to make the galvanic effect easily occur, it is preferable to electrically connect a metal, which needs to be etched, to a metal whose standard electrode potential is higher than that of the metal to be etched by 100 mV or more. For example, since the standard electrode potential of copper (Cu) is +0.3419 V, it is preferable to electrically connect copper (Cu) to gold (Au) whose standard electrode potential is +1.692 V, palladium (Pd) whose standard electrode potential is +0.951 V, silver (Ag) whose standard electrode potential is +0.7996 V, or the like. The standard electrode potential referred to herein is the electrode potential of oxidation-reduction reaction with respect to the standard hydrogen electrode (NHE). In addition, the galvanic effect is likely to occur as the electrical resistance between dissimilar metals is small.

In the present embodiment, the area ratio between the second surface of the first metal layer 22x exposed in the opening 21x and the exposed surface of the wiring layer 16 exposed in the opening 17x is larger than the area ratio between the second surface of the second metal layer 22y exposed in the opening 21y and the exposed surface of the wiring layer 16 exposed in the opening 17y. Therefore, since the wiring layer 16 exposed in the opening 17x is more etched than the wiring layer 16 exposed in the opening 17y (etched at high speed), the depth of the recess 16x is larger than the depth of the recess 16y.

For example, assume that the area ratio between the second surface of the first metal layer 22x exposed in the opening 21x and the exposed surface of the wiring layer 16 exposed in the opening 17x is 2 and the area ratio between the second surface of the second metal layer 22y exposed in the opening 21y and the exposed surface of the wiring layer 16 exposed in the opening 17y is 1. In this case, from the equation (1), the wiring layer 16 exposed in the opening 17x is etched at a rate of 1.5 times the etching rate of the wiring layer 16 exposed in the opening 17y. As a result, the depth of the recess 16x is larger than the depth of the recess 16y.

This, it is possible to change the depths of the recesses 16x and 16y according to the area ratio between the second surface of the first metal layer 22x exposed in the opening 21x and the exposed surface of the wiring layer 16 exposed in the opening 17x and the area ratio between the second surface of the second metal layer 22y exposed in the opening 21y and the exposed surface of the wiring layer 16 exposed in the opening 17y.

Returning to the process of manufacturing the wiring substrate 10, a metal layer is formed on the inner bottom surface or the internal surface of each of the recesses 16x and 16y exposed in the openings 17x and 17y or anti-oxidation processing is performed, when necessary, after the process shown in FIG. 2B. As the metal layer, for example, the same configuration as the first metal layer 22x or the second metal layer 22y may be used. Specifically, an Au layer, an Ni/Au layer (metal layer formed by laminating an Ni layer and an Au layer in this order), and an Ni/Pd/Au layer (metal layer formed by laminating an Ni layer, a Pd layer, and an Au layer in this order) may be formed using an electroless plating method, for example. As the anti-oxidation processing, for example, OSP (Organic Solderability Preservative) processing may be performed.

Then, the electrode terminal 18 is formed by mounting solder balls with the same diameter simultaneously on the recesses 16$x$ and 16$y$ with different opening areas and different depths and performing reflow. As examples of the material of the electrode terminal 18, an alloy containing Pb, an alloy of Sn and Cu, an alloy of Sn and Ag, and an alloy of Sn, Ag, and Cu may be used. The height of the electrode terminal 18 after reflow is fixed by setting the relationship between the opening area and the depth of the recesses 16$x$ and 16$y$ in advance so that the height of the electrode terminal 18 after reflow is fixed. In addition, "fixed" referred to herein includes not only a case where the height is strictly fixed but also a case where the height is varied to the extent that does not cause a trouble when electrically connecting the electrode terminal 18 to a semiconductor chip or the like. According to the above process, the wiring substrate 10 shown in FIG. 1A is formed.

Thus, in the first embodiment, metal having a smaller ionization tendency than the material of the wiring layer 16 is selected as the material of the outermost layer of each of the first and second metal layers 22$x$ and 22$y$ in the wiring substrate 10. Then, the opening 17$x$, through which the wiring layer 16 is exposed, and the opening 17$y$, which has a larger opening area than the opening 17$x$, are provided in the solder resist layer 17. Then, the wiring layer 16 exposed in the opening 17$x$ is electrically connected to the first metal layer 22$x$, and the wiring layer 16 exposed in the opening 17$y$ is electrically connected to the second metal layer 22$y$. Then, the exposed surface of the wiring layer 16 exposed from each of the openings 17$x$ and 17$y$ of the solder resist layer 17, the second surface of the first metal layer 22$x$ exposed from the opening 21$x$ of the solder resist layer 21, and the second surface of the second metal layer 22$y$ exposed from the opening 21$y$ of the solder resist layer 21 are immersed in the etchant capable of etching the first metal.

As a result, the recesses 16$x$ and 16$y$ according to the diameters of the openings 17$x$ and 17$y$ are respectively formed in the wiring layer 16 exposed in the opening 17$x$ and the wiring layer 16 exposed in the opening 17$y$.

In the present embodiment, the area ratio between the second surface of the first metal layer 22$x$ exposed in the opening 21$x$ and the exposed surface of the wiring layer 16 exposed in the opening 17$x$ is larger than the area ratio between the second surface of the second metal layer 22$y$ exposed in the opening 21$y$ and the exposed surface of the wiring layer 16 exposed in the opening 17$y$. Therefore, since the wiring layer 16 exposed in the opening 17$x$ is more etched than the wiring layer 16 exposed in the opening 17$y$ (etched at high speed) due to the galvanic effect, the depth of the recess 16$x$ is larger than the depth of the recess 16$y$.

As described above, since the galvanic effect is determined by the standard electron potential between dissimilar metals, the area ratio of dissimilar metals, and the like, the depths of the recesses 16$x$ and 16$y$ can be set to desired depths by controlling the standard electron potential between dissimilar metals, the area ratio of dissimilar metals, and the like. That is, the opening area and the depth of each of the recesses 16$x$ and 16$y$ can be set in advance so that the height of the electrode terminal 18 after reflow is fixed when forming the electrode terminal 18 by mounting solder balls with the same diameter simultaneously on the recesses 16$x$ and 16$y$ and performing reflow.

In the pad forming method according to the present embodiment, it is not necessary to open only a pad with a small opening area by resist patterning and perform etching using an etchant, which has been described in the Background Art. That is, since resist patterning is not used, a problem related to the alignment accuracy at the time of resist patterning does not occur. Therefore, even if the opening area becomes very small, a recess with a desired depth can be easily formed.

Modification of the First Embodiment

In a modification of the first embodiment, another example of the method of manufacturing the wiring substrate 10 according to the first embodiment will be now described. In addition, in the modification of the first embodiment, explanation regarding the same components as in the embodiment described previously will be omitted.

FIGS. 4A, 4B, 5A, and 5B are diagrams illustrated the process of manufacturing a wiring substrate according to the modification of the first embodiment. First, in the process shown in FIG. 4A, the wiring layer 12, the insulating layer 15, the wiring layer 16, and the solder resist layer 17 are sequentially formed on one surface of the core layer 11, in the same manner as in the process shown in FIG. 2A. In addition, the wiring layer 13, the insulating layer 19, the wiring layer 20, and the solder resist layer 21 are sequentially formed on the other surface of the core layer 11.

Then, the first metal layer 22$x$ is formed on the wiring layer 20 exposed in the opening 21$x$ using a known technique. For example, the first metal layer 22$x$ is formed using an electroless plating method or the like. The first metal layer 22$x$ is formed on only the wiring layer 20 electrically connected to the wiring layer 16 in which a deep recess needs to be formed (which needs to be etched more) in the formation of the recesses 16$x$ and 16$y$ described later.

For example, in the modification of the first embodiment, the first metal layer 22$x$ is formed on the wiring layer 20 (first metal layer forming portion) exposed from the opening 21$x$ of the solder resist layer 21 electrically connected to the wiring layer 16 (first pad forming portion) exposed from the opening 17$x$ with a small opening diameter between the openings 17$x$ and 17$y$ of the solder resist layer 17.

Figure 4A:
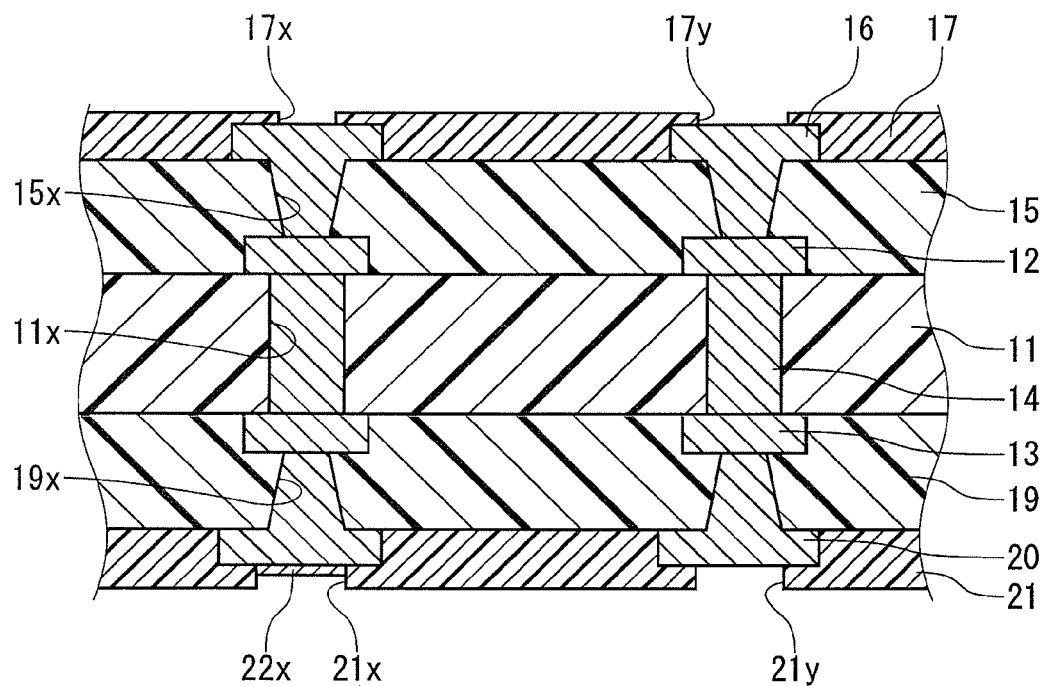
FIGS. 4A and 4B are diagrams illustrating the process of manufacturing a wiring substrate according to a first modification of the first embodiment.

That is, in the process shown in FIG. 4A, the second metal layer 22$y$ is not formed on the wiring layer 20 exposed in the opening 21$y$, unlike the process shown in FIG. 2A. In order not to form the second metal layer 22$y$, it is preferable to mask the wiring layer 20 exposed in the opening 21$y$ when forming the first metal layer 22$x$ using an electroless plating method or the like and then remove the mask after forming the first metal layer 22$x$, for example.

Figure 4B:
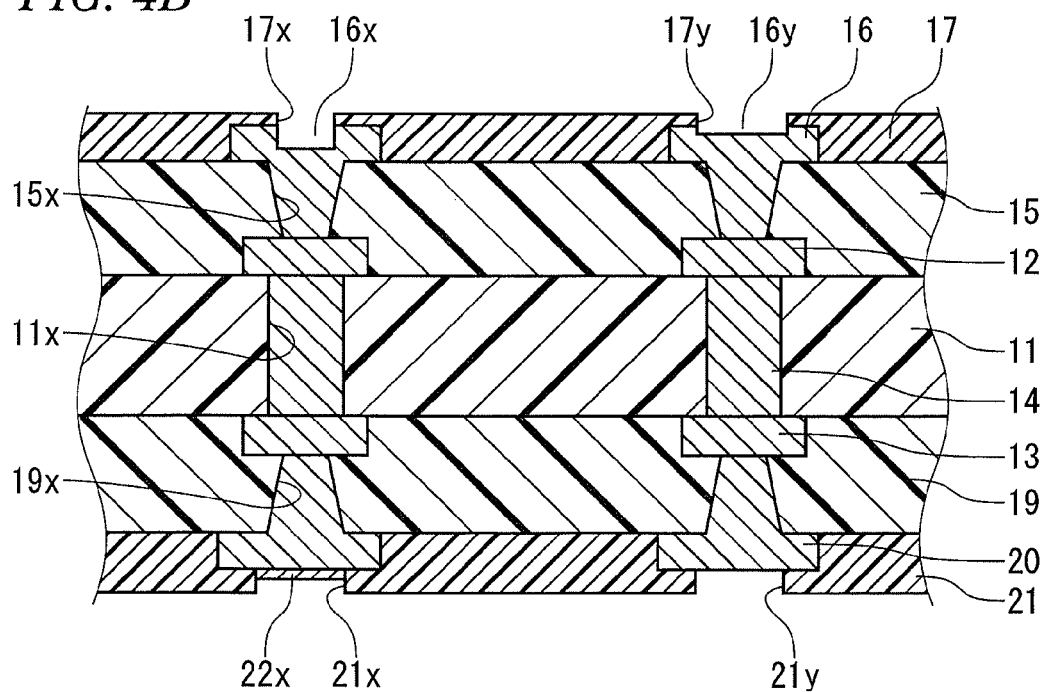

Then, in the process shown in FIG. 4B, the entire structure shown in FIG. 4A is immersed in the etchant (etchant using an oxidizing agent) capable of etching the material (first metal) that forms the wiring layer 16. That is, the exposed surface of the wiring layer 16 exposed in the opening 17$x$, the exposed surface of the wiring layer 16 exposed in the opening 17$y$, the second surface of the first metal layer 22$x$ exposed from the opening 21$x$, and the second surface of the wiring layer 20 exposed from the opening 21$y$ come into contact with the etchant. As the etchant using an oxidizing agent, for example, a sulfuric acid hydrogen based etchant or a persulfate-based etchant may be used.

In this manner, the exposed surface of the wiring layer 16 exposed in the opening 17$x$ and the exposed surface of the wiring layer 16 exposed in the opening 17$y$ are removed by etching. As a result, the recess 16$x$ and the recess 16, which are recesses having circular planar shapes, are formed in the openings 17x and 17y, respectively.

In this case, according to the relationship between the diameters of the openings 17x and 17y, the diameter of the recess 16x is smaller than the diameter of the recess 16y. In addition, due to the galvanic effect, the wiring layer 16 exposed in the opening 17x that is connected to a dissimilar metal is etched more than the wiring layer 16 exposed from the opening 17y that is not connected to a dissimilar metal. As a result, the depth of the recess 16x is larger than the depth of the recess 16y. In addition, since the galvanic effect does not occur at all in the wiring layer 16 exposed from the opening 17y that is not connected to a dissimilar metal, the recess 16y in the modification of the first embodiment is shallower than the recess 16y in the first embodiment. In addition, although not clearly shown in FIG. 4B, in this etching process, the wiring layer 20 exposed from the opening 21y is also slightly etched.

Then, in the process shown in FIG. 5A, the second metal layer 22y is formed on the wiring layer 20, which is exposed in the opening 21y and on which the first metal layer 22x has not been formed in the process shown in FIG. 4A, using the same method as when forming the first metal layer 22x, for example.

Figure 5:
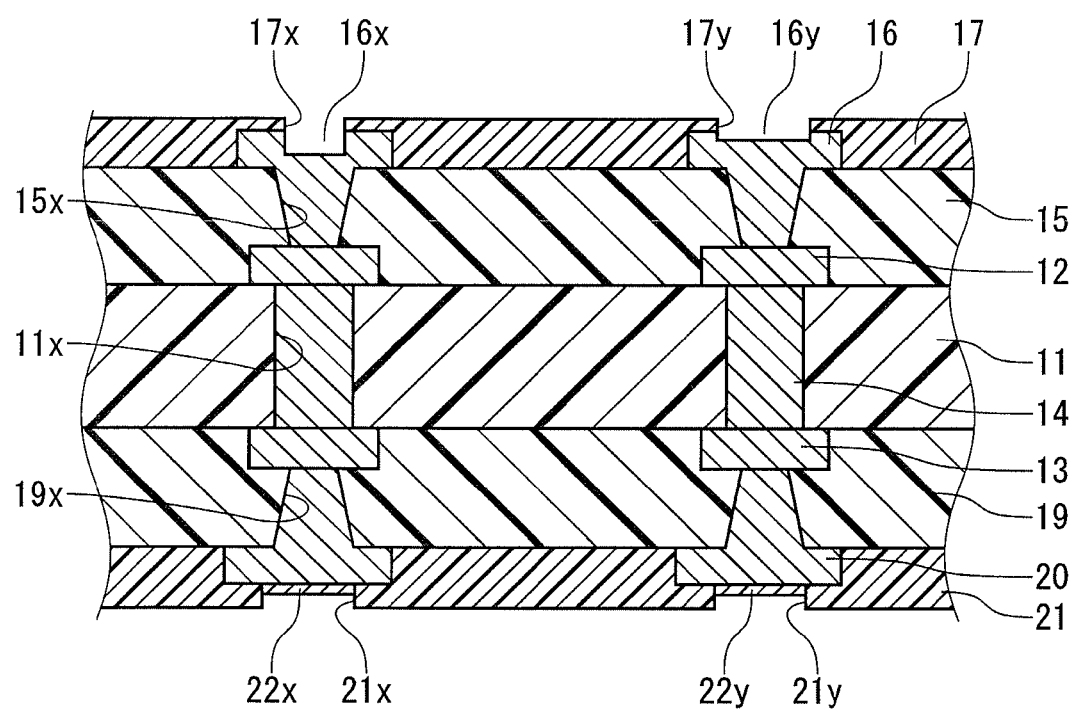
FIG. 5 is a diagram illustrating the process of manufacturing a wiring substrate according to a second modification of the first embodiment.

In addition, after the process shown in FIG. 5, a metal layer may be formed on the inner bottom surface or the internal surface of each of the recesses 16x and 16y exposed through the openings 17x and 17y, or anti-oxidation processing may be performed when necessary. Examples of the metal layer and the anti-oxidation processing are the same as those described in the first embodiment. Then, similar to the first embodiment, the electrode terminal 18 is formed by mounting solder balls with the same diameter simultaneously on the recesses 16x and 16y with different opening areas and different depths and performing reflow soldering, thereby forming the wiring substrate 10 shown in FIG. 1A.

Thus, in the modification of the first embodiment, only the first metal layer 22x is formed in the metal layer forming process shown in FIG. 4A, the recesses 16x and 16y is formed in the process shown in FIG. 4B, and then the second metal layer 22y is formed in the process shown in FIG. 5. In the process shown in FIG. 4B, the galvanic effect does not occur since the wiring layer 16 exposed in the opening 17y is not connected to a dissimilar metal. Therefore, the recess 16y is formed to be shallow, compared with the process shown in FIG. 2B. That is, it is possible to increase the difference in the depth of the recesses 16x and 16y.

However, the first embodiment, in which the first and second metal layers 22x and 22y can be formed simultaneously in the metal layer forming process shown in FIG. 2B, is more advantageous in that the manufacturing process can be simplified.

Second Embodiment

In a second embodiment, an example where the area of the second surface of the first metal layer 22x exposed in the opening 21x is set to be larger than that in the first embodiment. In addition, in the second embodiment, explanation regarding the same components as in the embodiment described previously will be omitted.

Figure 6A:
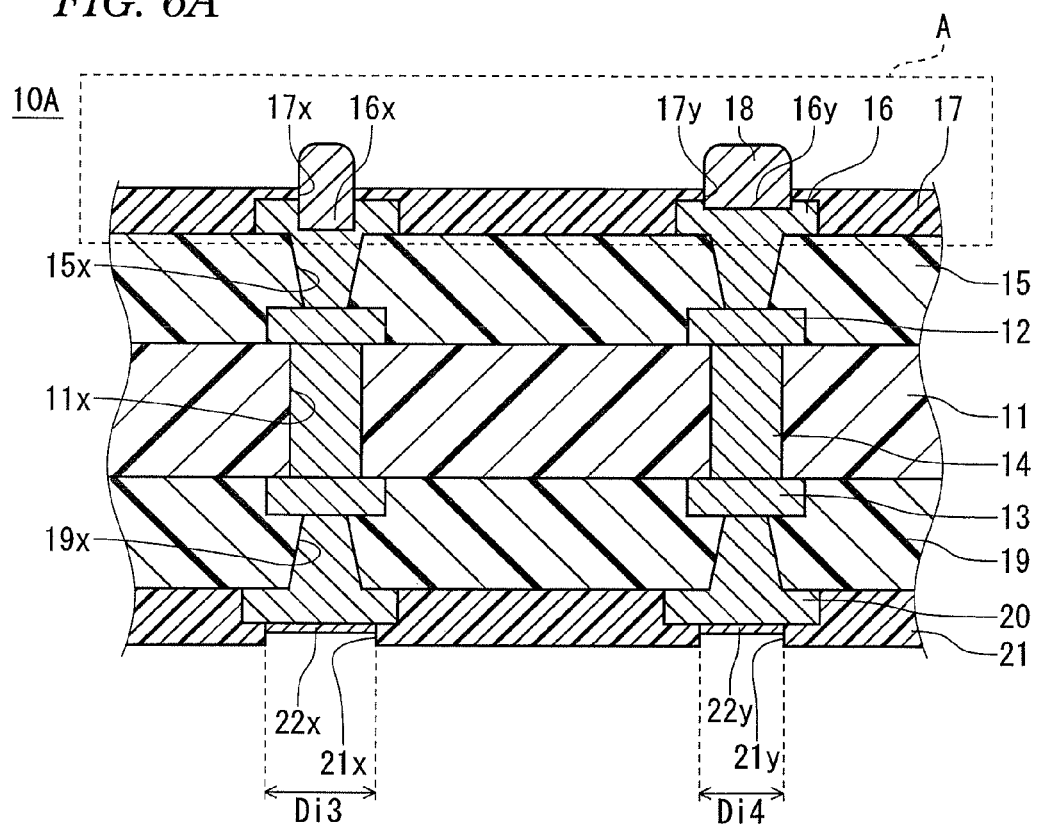
FIGS. 6A and 6B are cross-sectional views illustrating a wiring substrate according to a second embodiment.
Figure 6B:
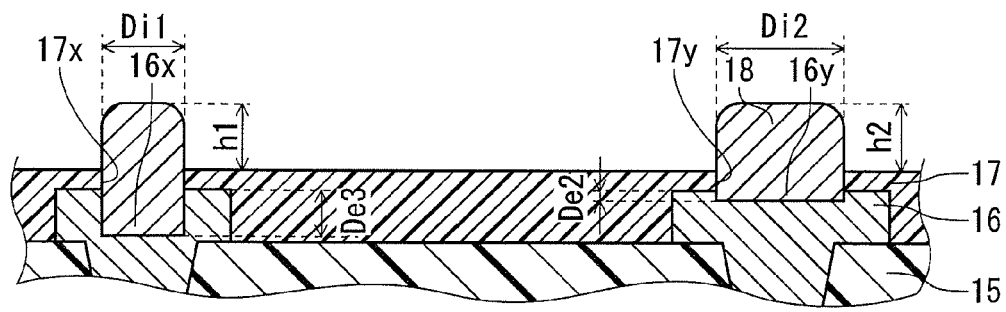

FIG. 6A is a cross-sectional view illustrating a wiring substrate according to the second embodiment. Referring to FIG. 6A, in a wiring substrate 10A according to the second embodiment, the opening area of the opening 21x is larger than that in the wiring substrate 10 (refer to FIG. 1A) according to the first embodiment. In other words, the diameter Di3 of the opening 21x is larger than the diameter Di4 of the opening 21y.

In addition, the opening area of the opening 21y is the same as that in the wiring substrate 10 (refer to FIG. 1A) according to the first embodiment. That is, in the wiring substrate 10A according to the second embodiment, the area of the second surface of the second metal layer 22y exposed in the opening 21y is the same as that in the wiring substrate 10 (refer to FIG. 1A) according to the first embodiment.

As can be seen from the above explanation, in the wiring substrate 10A, the area ratio between the second surface of the first metal layer 22x exposed in the opening 21x and the exposed surface of the wiring layer 16 exposed in the opening 17x is larger than that in the wiring substrate 10 (refer to FIG. 1A) according to the first embodiment. Therefore, as is also apparent from the equation (1), the depth De3 of the recess 16x of the wiring substrate 10A is larger than the depth De1 of the recess 16x of the wiring substrate 10 (e.g., see FIG. 1A).

The wiring substrate 10A can be manufactured by the same manufacturing process as for the wiring substrate 10. However, in the process shown in FIG. 2A, the opening area of the opening 21x is larger than that in the first embodiment.

Thus, the recess 16x can be made deeper by further increasing the area ratio between the second surface of the first metal layer 22x exposed in the opening 21x and the exposed surface of the wiring layer 16 exposed in the opening 17x.

Third Embodiment

In a third embodiment, an example where a third metal layer 22z is provided on the same side as the wiring layer 16 exposed in the opening 17x will be described. In addition, in the third embodiment, explanation regarding the same components as in the embodiment described previously will be omitted.

Figure 7:
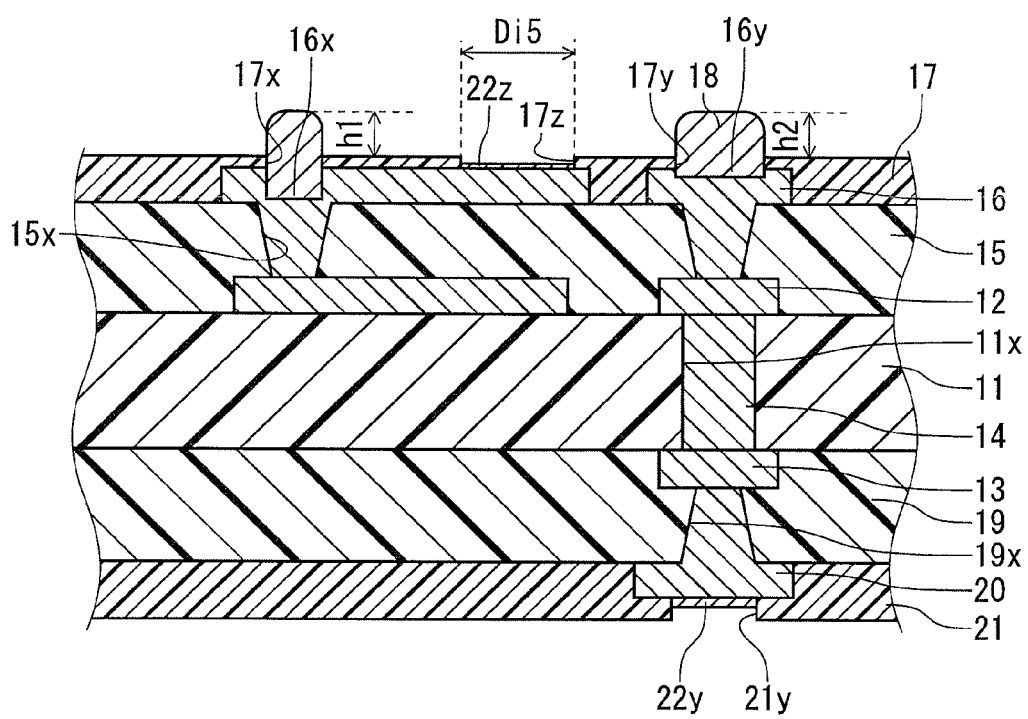
FIG. 7 is a cross-sectional view illustrating a wiring substrate according to a third embodiment.

FIG. 7 is a cross-sectional view illustrating a wiring substrate according to the third embodiment. Referring to FIG. 7, a wiring substrate 10B according to the third embodiment is different from the wiring substrate 10A (see FIG. 6A) according to the second embodiment in the following points. That is, on one side of the wiring substrate 10B, an opening 17z through which the wiring layer 16 is exposed is formed in the solder resist layer 17. In addition, the wiring layer 16 exposed in the opening 17x and the wiring layer 16 exposed in the opening 17z are electrically connected to each other, and the third metal layer 22z is formed on the wiring layer 16 exposed in the opening 17z.

In addition, the wiring substrate 10B according to the third embodiment is the same as the wiring substrate 10A (see FIG. 6A) according to the second embodiment in that the wiring layer 16 exposed in the opening 17x is electrically connected to the second metal layer 22y exposed in the opening 21y.

In the wiring substrate 10B, the opening area of the opening 17z is set to be equal to the opening area (diameter Di3) of the opening 21x of the wiring substrate 10A (refer to FIG. 6A). Therefore, the area (diameter Di5) of the second surface of the third metal layer 22z exposed in the opening 17z is the same as the area (diameter Di3) of the second surface of the first metal layer 22x exposed in the opening 21x of the wiring substrate 10A (see FIG. 6A). That is, the area ratio between the second surface of the third metal layer 22z exposed in the opening 17z in the wiring substrate 10B and the exposed surface of the wiring layer 16 exposed in the opening 17x is the same as that in the wiring substrate 10A (see FIG. 6A). Therefore, the depth of the recess 16x is the same as that in the wiring substrate 10A (see FIG. 6A). The first surface of the third metal layer 22z opposite to the second surface thereof is in contact with the exposed surface of the wiring layer 16 exposed in the opening 17z.

The wiring substrate 10B can be manufactured by the same manufacturing process as for the wiring substrate 10. However, in the process shown in FIG. 2A, the opening 17z is formed simultaneously with the openings 17x and 17y. In addition, in the process shown in FIG. 2A, the second metal layer 22y is formed on the wiring layer 20 exposed in the opening 21y. At the same time, the third metal layer 22z is formed on the wiring layer 16 (third metal layer forming portion) exposed in the opening 17z.

Thus, even if the third metal layer 22z is provided on the same side as the wiring layer 16 exposed in the opening 17x, the same effect as when the first metal layer 22x is provided on the opposite side to the wiring layer 16 exposed in the opening 17x can be obtained.

Fourth Embodiment

In a fourth embodiment, an example where the wiring layer 16 exposed in the opening 17y is electrically connected to the wiring layer 16 exposed in an opening 17t through the wiring layer 12 will be described now. In addition, in the fourth embodiment, explanation regarding the same components as in the embodiment described previously will be omitted.

Figure 8:
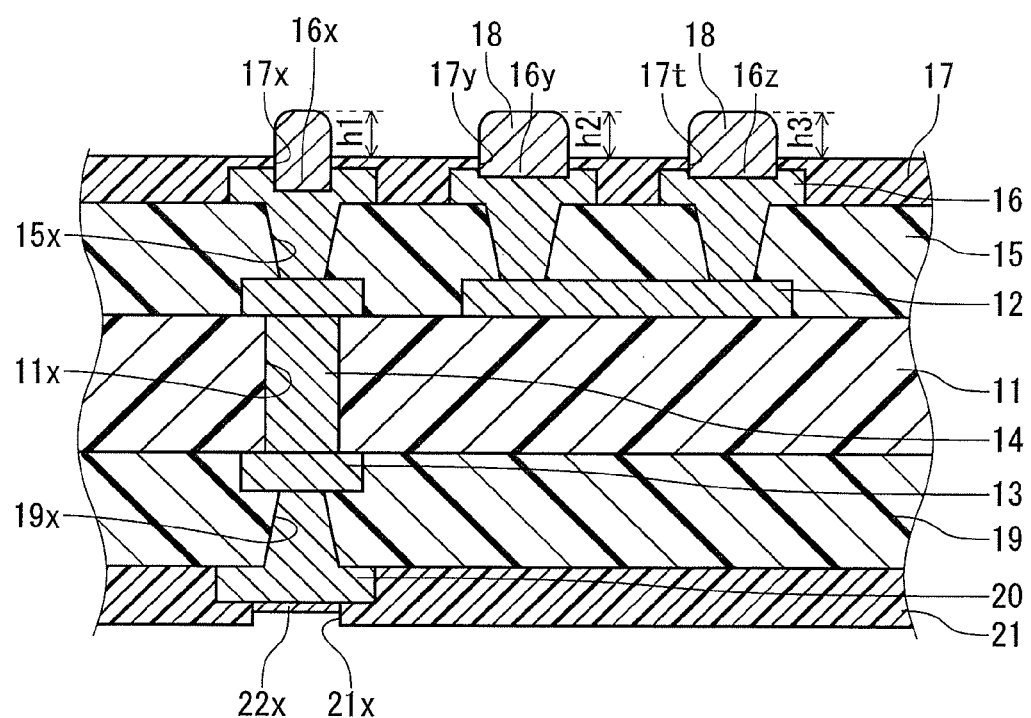
FIG. 8 is a cross-sectional view illustrating a wiring substrate according to a fourth embodiment.

FIG. 8 is a cross-sectional view illustrating a wiring substrate according to the fourth embodiment. Referring to FIG. 8, a wiring substrate 10C according to the fourth embodiment is different from the wiring substrate 10 (see FIG. 1A) according to the first embodiment in the following points. That is, the opening 17t through which the wiring layer 16 is exposed is formed in the solder resist layer 17. In addition, the wiring layer 16 exposed in the opening 17y and the wiring layer 16 exposed in the opening 17t are electrically connected to each other through the wiring layer 12, and a recess 16z is exposed in the opening 17t.

In the wiring substrate 10C, the depth of the recess 16z is approximately the same as the depth of the recess 16y. In addition, the opening area of the opening 17y is approximately the same as the opening area of the opening 17t. In addition, the height (maximum height) $h_1$ of the electrode terminal 18 formed in the recess 16x from one surface of the solder resist layer 17, the height (maximum height) $h_2$ of the electrode terminal 18 formed in the recess 16y from one surface of the solder resist layer 17, and the height (maximum height) $h_3$ of the electrode terminal 18 formed in the recess 16z from one surface of the solder resist layer 17 are approximately the same. The height (maximum height) $h_1$, $h_2$, and $h_3$ may be set to about 30 μm, for example.

In addition, the wiring substrate 10C according to the fourth embodiment is the same as the wiring substrate 10 (see FIG. 1A) according to the first embodiment in that the wiring layer 16 exposed in the opening 17x is electrically connected to the first metal layer 22x exposed in the opening 21x.

In the wiring substrate 10C, the area ratio between the second surface of the first metal layer 22x exposed in the opening 17x and the exposed surface of the wiring layer 16 exposed in the opening 21x is the same as that in the wiring substrate 10 (see FIG. 1A) according to the first embodiment. Therefore, the depth of the recess 16x is the same as that in the wiring substrate 10 (see FIG. 1A).

The wiring substrate 10C can be manufactured by the same manufacturing process as for the wiring substrate 10. However, in the process shown in FIG. 2A, the opening 17t is formed when forming the openings 17x and 17y, is formed, and the wiring layer 16 exposed in the opening 17y is electrically connected to the wiring layer 16 exposed in the opening 17t through the wiring layer 12.

In addition, the wiring layer 16 exposed in the opening 17y and the wiring layer 16 exposed in the opening 17t are not connected to a dissimilar metal. Therefore, in the process shown in FIG. 2B, the wiring layer 16 exposed in the opening 17x that is connected to a dissimilar metal is etched more than the wiring layer 16 exposed in the second and sixth openings 17y and 17t that are not connected to a dissimilar metal, due to the galvanic effect. As a result, the depth of the recess 16x is larger than the depths of the recesses 16y and 16z.

Thus, even when the wiring layer 16 exposed in the opening 17y is electrically connected to the wiring layer 16 exposed in the opening 17t formed on the same side as the opening 17y, the same effect as in the first embodiment is obtained.

Examples of the present invention are illustrated below.

First Example

In a first example, in the wiring substrate 10 shown in FIG. 1A, the difference in the actual amount of etching (etching rate) between the wiring layer 16 exposed in the opening 17x and the wiring layer 16 exposed in the opening 17y was measured in the process shown in FIG. 4B.

Specifically, twelve samples of the structure shown in FIG. 4B in which the area ratio between the second surface of the first metal layer 22x exposed in the opening 21x and the exposed surface of the wiring layer 16 exposed in the opening 17x was set to 80 were manufactured, and each sample was put into the sulfuric acid hydrogen based etchant. Then, for each sample, the depth (amount of etching) of each of the recesses 16x and 16y was measured using the cross-sectional observation.

As a result of the measurement, the average depth (amount of etching) of the recess 16y was 0.9 μm, while the depth (amount of etching) of the average depth of the recess 16x was 6.3 μm. That is, the recess 16x was etched about 6 times the recess 16y (the etching rate of the recess 16x was about 6 times that of the recess 16y).

Thus, since the wiring layer 16 exposed in the opening 17x electrically connected to the first metal layer 22x was etched more than the wiring layer 16 exposed in the opening 17y, which was not electrically connected to a dissimilar metal, due to the galvanic effect, it was confirmed that a deeper recess was formed.

Second Example

In a second example, a wiring substrate having a changed area ratio between a gold pad and a copper wiring line was manufactured, and changes in the wiring width of the copper wiring line before and after etching were measured. In addition, as a comparative example, a wiring substrate having a changed area ratio between a copper pad and a copper wiring line was manufactured, and changes in the wiring width of the copper wiring line before and after etching were measured.

Figure 9:
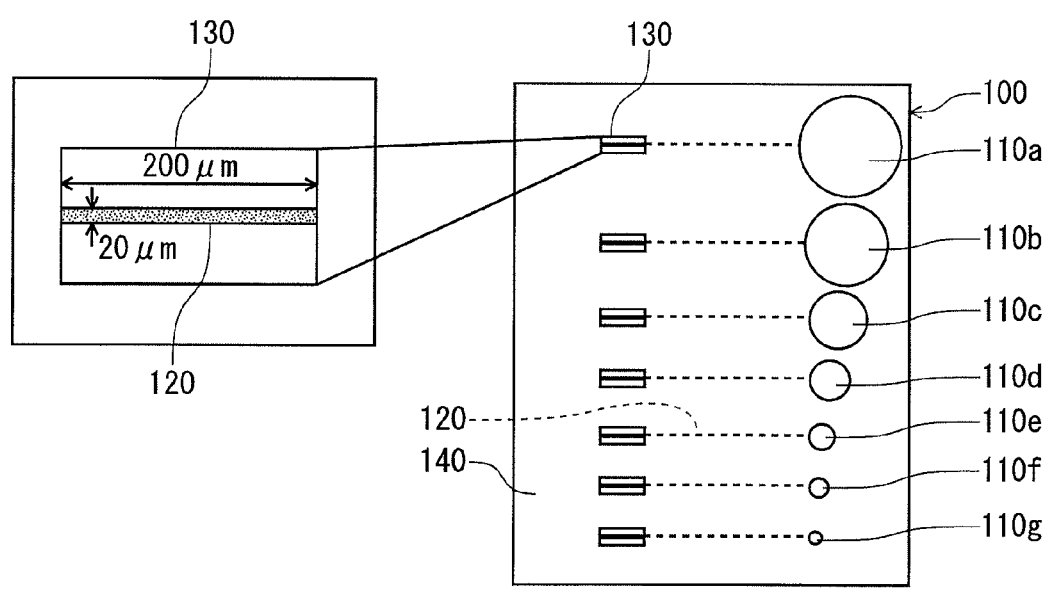
FIG. 9 is a schematic diagram showing the wiring substrate manufactured in a second example.

FIG. 9 is a schematic diagram showing a wiring substrate manufactured in the second example. Pads 110a to 110g, a plurality of copper wiring lines 120, and a plurality of openings 130 are formed in the wiring substrate 100. One end of each copper wiring line 120 was connected to the pads 110a to 110g, and the other end was exposed in each opening 130. In addition, a diagram on the left side of FIG. 9 is an enlarged view of the opening 130 in a diagram on the right side. The copper wiring line 120 having a width of about 20 μm and a length of about 200 μm is exposed in the opening 130. A region other than the pads 110a to 110g and the openings 130 is covered by a solder resist layer 140.

The area ratios of the pads 110a to 110g and the copper wiring line 120 exposed in each opening 130 are set to 250, 125, 25, 12.5, 2.5, 1.2, and 0.25, respectively, from the top side in the drawing. For each of the case when the pads 110a to 110g were gold and the case when the pads 110a to 110g were copper, changes in the wiring width of each copper wiring line 120 exposed in each opening 130 before and after etching were measured.

Figure 10:
FIG. 10 is a diagram showing the observation result of changes in the wiring width of each copper wiring line.

FIG. 10 is a diagram showing the observation result of the changes in the wiring width of each copper wiring line. In FIG. 10, "unprocessed" in the upper column indicates each copper wiring line 120 exposed in each opening 130 before etching, and "Au" in the middle column indicates each copper wiring line 120 exposed in each opening 130 after etching when the pads 110a to 110g shown in FIG. 9 are gold. In addition, "Cu" in the lower column indicates each copper wiring line 120 exposed in each opening 130 after etching when the pads 110a to 110g shown in FIG. 9 are copper. In addition, each copper wiring line 120 exposed in each opening 130 was observed using a microscope.

As shown in FIG. 10, in the case of the copper wiring line 120 electrically connected to the Au pad, as the area ratio increases, the wiring width after etching decreases (the amount of etching increases). In particular, when the area ratio is 125 and 250, the copper wiring line 120 has almost disappeared. On the other hand, in the case of the copper wiring line 120 electrically connected to the Cu pad, the wiring width change after etching is small regardless the area ratio compared with that in the case of the copper wiring line 120 electrically connected to the Au pad.

Figure 11:
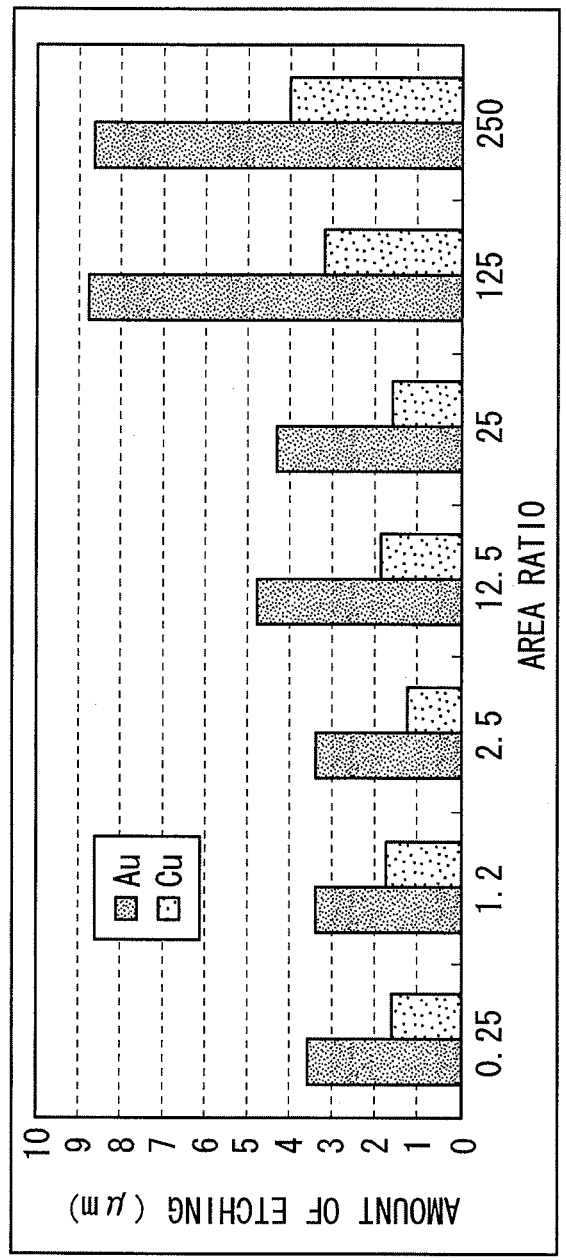
FIG. 11 is a diagram showing the amount of etching calculated based on measurement results of the wiring width of the copper wiring line before and after etching.

FIG. 11 is a diagram showing the amount of etching calculated based on measurement results of the wiring width of the copper wiring line before and after etching. As shown in FIG. 11, in cases of all area ratios, the amount of etching of the copper wiring line 120 electrically connected to the Au pad is larger than that of the copper wiring line 120 electrically connected to the Cu pad.

Specifically, in the area ratio of 0.25 to 25, the amount of etching of the copper wiring line 120 electrically connected to the Au pad is about twice the amount of etching of the copper wiring line electrically connected to the Cu pad. In addition, in the area ratio of 125 or more, the difference between the amount of etching of the copper wiring line 120 electrically connected to the Au pad and the amount of etching of the copper wiring line 120 electrically connected to the Cu pad is further increased. In addition, in FIG. 11, the amount of etching is less than 9 μm in the area ratio of 125 or more. However, as shown in FIG. 10, since the copper wiring line 120 electrically connected to the Au pad almost disappears in the area ratio of 125 or more, it is thought that the actual amount of etching is much larger.

Thus, it was confirmed that the amount of etching of the less noble metal (in this case, copper wiring line) increased as the area ratio between the less noble metal (in this case, copper wiring line) and the noble metal (in this case, gold pad) increased. In addition, it was confirmed that an increase in the amount of etching of the less noble metal (in this case, copper wiring line) became noticeable as the area ratio between the less noble metal (in this case, copper wiring line) and the noble metal (in this case, gold pad) increased to some extent (for example, 125 or more).

While the preferred embodiments and their modifications and examples have been described now, the present invention is not limited to the preferred embodiments and their modifications and examples described above, and the preferred embodiments and their modifications and examples may be modified and replaced in various ways without deviating from the scope defined in the appended claims.

For example, in each embodiment and each example, the case where copper (Cu) is used as a material of the wiring layer 16, which forms the recesses 16x and 16y, and gold (Au) is used as a material of the outermost layer of the first metal layer 22x has been illustrated. However, the material of the wiring layer 16 that forms the recesses 16x and 16y is not limited to the combination of the metal shown in each embodiment and each example since a metal having a larger ionization tendency than the material of the outermost layer of the first metal layer 22x can be selected. For example, copper (Cu) may be used as a material of the wiring layer 16, which forms the recesses 16x and 16y, and palladium (Pd) or silver (Ag) may be used as a material of the outermost layer of the first metal layer 22x. Alternatively, Ni (nickel) or iron (Fe) may be used as a material of the wiring layer 16, which forms the recesses 16x and 16y, and copper (Cu) may be used as a material of the outermost layer of the first metal layer 22x.

In addition, the respective embodiments may be appropriately combined.

In addition, in each embodiment and each example, metal layers containing the second metal (for example, Au) serving as a local cathode have been described as the first metal layer 22x, the second metal layer 22y, and the third metal layer 22z for the sake of convenience. However, the first metal layer 22x, the second metal layer 22y, and the third metal layer 22z have the same configuration. In addition, the metal layer formed on the inner bottom surface or the internal surface of each of the recesses 16x and 16y may have the same configuration as the first to third metal layers 22x to 22z or may have a different configuration.

In addition, although each embodiment and its modification have showed an example where the present invention is applied to the wiring substrate having a core layer, the present invention may also be applied to a coreless substrate.

What is claimed is:

1. A wiring substrate comprising:
   a wiring substrate body comprising a wiring layer and an insulating layer and comprising a first surface and a second surface opposite to the first surface;
   a first electrode pad comprising a first recess therein and formed on the first surface of the wiring substrate body;
   a second electrode pad comprising a second recess therein and formed on the first surface of the wiring substrate body;
   a first solder resist layer on the first surface of the wiring substrate body to cover the first and second electrode pads, the first solder resist layer comprising a first opening and a second opening whose opening area is larger than that of the first opening, wherein the first recess is exposed through the first opening and the second recess is exposed through the second opening;
   a third electrode pad formed on the first surface or the second surface of the wiring substrate body; and
   a first metal layer formed on the third electrode pad and electrically connected to the first electrode pad and made of a material whose ionization tendency is smaller than that of a material of the first electrode pad,
   wherein a depth of the first recess is larger than that of the second recess.

2. The wiring substrate of claim 1, further comprising:
   a second solder resist layer on the second surface of the wiring substrate body and comprising a third opening,
   wherein the third electrode pad is formed on the second surface of the wiring substrate body and covered by the second solder resist layer such that the first metal layer is exposed through the third opening.

3. The wiring substrate of claim 2, further comprising:
a fourth electrode pad formed on the second surface of the wiring substrate body; and
a second metal layer formed on the fourth electrode pad and electrically connected to the second electrode pad and made of a material whose ionization tendency is smaller than that of a material of the second electrode pad,
wherein the second solder resist layer further comprises a fourth opening, and
the fourth electrode pad is covered by the second solder resist layer such that the second metal layer is exposed through the fourth opening.

4. The wiring substrate of claim 1, wherein the first solder resist layer further comprises a third opening,
wherein the third electrode pad is formed on the first surface of the wiring substrate body and covered by the first solder resist layer such that the first metal layer is exposed through the third opening.

5. A method of manufacturing a wiring substrate, the method comprising:
(a) providing a wiring substrate body comprising a wiring layer and an insulating layer and comprising a first surface and a second surface opposite to the first surface;
(b) forming a first electrode pad and a second electrode pad on the first surface of the wiring substrate body;
(c) forming a first solder resist layer on the first surface of the wiring substrate body to cover the first and second electrode pads;
(d) forming a first opening and a second opening through the first solder resist layer such that the first electrode pad is exposed through the first opening and the second electrode pad is exposed through the second opening, wherein an opening area of the second opening is larger than that of the first opening;
(e) forming a third electrode pad on the first surface or the second surface of the wiring substrate body;
(f) forming a first metal layer on the third electrode pad such that the first metal layer is electrically connected to the first electrode pad, wherein the first metal layer is made of a material whose ionization tendency is smaller than that of a material of the first electrode pad; and
(g) forming a first recess in the first electrode pad and forming a second recess in the second electrode by wet-etching the first and second electrode pads using an etchant in a state that the first and second electrode pads and the first metal layer are in contact with the etchant, wherein a depth of the first recess is larger than that of the second recess.

6. The method of claim 5, wherein the third electrode pad is formed on the second surface of the wiring substrate body, and
the method further comprising:
(h) forming a second solder resist on the second surface of the wiring substrate body to cover the third electrode; and
(i) forming a third opening through the second solder resist such that the first metal layer is exposed through the third opening.

7. The method of claim 6, further comprising:
(j) forming a fourth electrode pad on the second surface of the wiring substrate body; and
(k) forming a second metal layer on the fourth electrode pad such that the second electrode pad is electrically connected to the second electrode pad, wherein the second metal layer is made of a material whose ionization tendency is smaller than that of a material of the second electrode pad,
wherein the step (i) further comprises forming a fourth opening through the second solder resist such that the second metal layer is exposed through the fourth opening.

8. The method of claim 5, wherein
the third electrode pad is formed on the first surface of the wiring substrate body, and
the step (d) further comprises: forming a third opening through the first solder resist layer such that the first metal layer is exposed through the third opening.

9. The wiring substrate of claim 1, further comprising:
a first electrode terminal provided in the first recess of the first electrode pad; and
a second electrode terminal provided in the second recess of the second electrode pad, and
wherein a height of a distal end of the first electrode terminal with reference to the first surface of the wiring substrate body is substantially equal to a height of a distal end of the second electrode terminal with reference to the first surface of the wiring substrate body.

* * * * *